(12) United States Patent
Zhao et al.

(10) Patent No.: US 10,042,223 B2
(45) Date of Patent: Aug. 7, 2018

(54) TFT ARRAYS, DISPLAY PANELS, AND DISPLAY DEVICES

(71) Applicants: Shenzhen China Star Optoelectronics Technology Co., Ltd., Shenzhen, Guangdong (CN); Wuhan China Star Optoelectronics Technology Co., Ltd, Wuhan, Hubei (CN)

(72) Inventors: Mang Zhao, Guangdong (CN); Yong Tian, Guangdong (CN); Caiqin Chen, Guangdong (CN)

(73) Assignees: Shenzhen China Star Optoelectronics Technology Co., Ltd, Shenzhen, Guangdong (CN); Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 491 days.

(21) Appl. No.: 14/888,971

(22) PCT Filed: Jul. 31, 2015

(86) PCT No.: PCT/CN2015/085711
§ 371 (c)(1),
(2) Date: Nov. 4, 2015

(87) PCT Pub. No.: WO2017/015973
PCT Pub. Date: Feb. 2, 2017

(65) Prior Publication Data
US 2017/0160607 A1 Jun. 8, 2017

(30) Foreign Application Priority Data

Jul. 28, 2015 (CN) .......................... 2015 1 0451705

(51) Int. Cl.
*H02H 9/00* (2006.01)
*G02F 1/1362* (2006.01)
(Continued)

(52) U.S. Cl.
CPC ...... *G02F 1/136204* (2013.01); *G02F 1/1368* (2013.01); *G02F 1/136286* (2013.01);
(Continued)

(58) Field of Classification Search
CPC ................................................. G02F 1/136204
See application file for complete search history.

(56) References Cited

U.S. PATENT DOCUMENTS 7,990,664 B1 * 8/2011 Perisetty ............. H01L 27/0277
361/111
9,841,649 B2 * 12/2017 Zhang ............... G02F 1/136204
(Continued)

FOREIGN PATENT DOCUMENTS

CN 103927961 A 7/2014
CN 103928444 A 7/2014
JP 4200683 B2 12/2008

*Primary Examiner* — Stephen W Jackson
(74) *Attorney, Agent, or Firm* — Andrew C. Cheng (57) ABSTRACT

The present disclosure relates to an array substrate, a display panel and a display device. The array substrate includes GND wirings and GOA areas. The GND wirings are configured at outer sides of the GOA areas, and the GOA area includes a variety of GOA signal lines and N-th stage GOA circuits electrically connected by the GOA signal lines. A first ESD protection circuit is configured in a middle area between the 1-th stage GOA circuit and the N-th stage GOA circuit to discharge abnormal electrical charges of the GOA signal lines within the middle area. With such configuration, better ESD protection capability is provided between the GOA signal lines.

20 Claims, 4 Drawing Sheets

(51) Int. Cl.
  *G09G 3/36* (2006.01)
  *G02F 1/1368* (2006.01)
  *H01L 27/12* (2006.01)
  *H01L 27/02* (2006.01)
  *H02H 9/04* (2006.01)

(52) U.S. Cl.
  CPC ....... *G09G 3/3677* (2013.01); *H01L 27/0255* (2013.01); *H01L 27/0292* (2013.01); *H01L 27/0296* (2013.01); *H01L 27/1244* (2013.01); *H02H 9/046* (2013.01); *G02F 2201/503* (2013.01)

(56) References Cited

U.S. PATENT DOCUMENTS

| | | |
|---|---|---|
| 2008/0055505 A1 | 3/2008 | Yeh et al. |
| 2009/0279038 A1 | 11/2009 | Shie |
| 2015/0091018 A1 | 4/2015 | Kobashi |
| 2017/0168359 A1* | 6/2017 | Zhang ................. G02F 1/13454 |
| 2017/0242311 A1* | 8/2017 | Li ..................... G02F 1/136204 |

* cited by examiner

TFT ARRAYS, DISPLAY PANELS, AND DISPLAY DEVICES

BACKGROUND OF THE INVENTION

1. Field of the Invention

The present disclosure relates to liquid crystal display technology, and more particularly to an array substrate, a display panel and a display device.

2. Discussion of the Related Art

Static electricity is everywhere in our daily life. Minor static electricity may cause serious damage to electronic devices. With the development of technology, the volume of electronic devices have been decreased, which results in that the density of the integrated circuits (ICs) is high and thus the gap between the wirings is pretty narrow. Correspondingly, the capability to suffer the discharge of the static electricity is getting worse, that is, the sensibility toward the static electricity is getting higher. Thus, demands toward ESD protection during the manufacturing, testing, repair, and usage have been increased also.

With the development of display technology, a great deal of researches focus on the integration of system on panel (SOP), for instance, the ESD protection toward the IC within the panels is a main issue. Particularly, with respect to the array substrate adopting gate driver on array (GOA) technology, the ESD protection in a middle area between the signal lines may be ignored. However, during testing processes, static electricity may be generated in the middle area. When the amount of the static electricity is huge, the signal lines within the middle area may be brew out, which may result in malfunction panel.

SUMMARY

The object of the invention is to enhance the electrostatic discharge (ESD) protection capability of the middle area of the signal wiring of the array substrates.

In one aspect, an array substrate includes: GND wirings and GOA areas, the GND wirings being configured at outer sides of the GOA areas, the GOA area includes a variety of GOA signal lines and N-th stage GOA circuits electrically connected by the GOA signal lines, a first ESD protection circuit being configured in a middle area between the 1-th stage GOA circuit and the N-th stage GOA circuit to discharge abnormal electrical charges of the GOA signal lines within the middle area.

Wherein the first ESD protection circuit includes a plurality of ESD protection units between the GOA signal lines and the GND wirings.

Wherein the ESD protection units between the GOA signal lines and the GND wirings are configured to be symmetrical in the middle area.

Wherein the first ESD protection circuit includes a plurality of ESD protection units between the GOA signal lines.

Wherein the ESD protection units between the GOA signal lines are configured to be symmetrical in the middle area.

Wherein the GOA signal lines includes STV signal lines, U2D signal lines, CK signal lines, VGH signal lines, and VGL signal lines, the ESD protection units are provided between the STV signal line and the U2D signal line, between the U2D signal line and the CK signal line, between the CK signal line and the VGH signal line, or between the VGH signal line and the VGL signal line.

Wherein a second ESD protection circuit is configured respectively in the upper area of the 1-th stage GOA circuit and a down area of the N-th stage GOA circuit, the GOA signal lines comprise VGH signal lines and VGL signal lines; and the second ESD protection circuit includes the ESD protection units arranged between the VGH signal lines and the VGL signal lines in the upper area and arranged between the VGH signal lines and the VGL signal lines.

Wherein the ESD protection unit includes a first diode and a second diode connected in parallel, and a positive end of the first diode 1242 electrically connects to a negative end of the second diode, and the negative end of the first diode electrically connects to the positive end of the second diode.

In another aspect, a display panel includes: an array substrate includes GND wiring and GOA areas, GND wirings and GOA areas, the GND wirings being configured at outer sides of the GOA areas, the GOA area includes a variety of GOA signal lines and N-th stage GOA circuits electrically connected by the GOA signal lines, a first ESD protection circuit being configured in a middle area between the 1-th stage GOA circuit and the N-th stage GOA circuit to discharge abnormal electrical charges of the GOA signal lines within the middle area.

Wherein the first ESD protection circuit includes a plurality of ESD protection units between the GOA signal lines and the GND wirings.

Wherein the ESD protection units between the GOA signal lines and the GND wirings are configured to be symmetrical in the middle area.

Wherein the first ESD protection circuit includes a plurality of ESD protection units between the GOA signal lines.

Wherein the ESD protection units between the GOA signal lines are configured to be symmetrical in the middle area.

Wherein the GOA signal lines includes STV signal lines, U2D signal lines, CK signal lines, VGH signal lines, and VGL signal lines, the ESD protection units are provided between the STV signal line and the U2D signal line, between the U2D signal line and the CK signal line, between the CK signal line and the VGH signal line, or between the VGH signal line and the VGL signal line.

In another aspect, a display device includes: a display panel includes an array substrate, the array substrate includes GND wiring and GOA areas, GND wirings and GOA areas, the GND wirings being configured at outer sides of the GOA areas, the GOA area includes a variety of GOA signal lines and N-th stage GOA circuits electrically connected by the GOA signal lines, a first ESD protection circuit being configured in a middle area between the 1-th stage GOA circuit and the N-th stage GOA circuit to discharge abnormal electrical charges of the GOA signal lines within the middle area.

Wherein the first ESD protection circuit includes a plurality of ESD protection units between the GOA signal lines and the GND wirings.

Wherein the ESD protection units between the GOA signal lines and the GND wirings are configured to be symmetrical in the middle area.

Wherein the first ESD protection circuit includes a plurality of ESD protection units between the GOA signal lines.

In view of the above, the array substrate includes at least one GOA area and GND wirings arranged at outer sides of the GOA area. The GOA area includes a variety of GOA signal lines and N-th stage circuit connected by the GOA signal lines. The middle area between the 1-th stage GOA circuit and the N-th stage GOA circuit includes a first ESD protection circuit for discharging abnormal charges in the middle area generated by the GOA signal lines. With such configuration, a huge amount of static electricity is prevented from being generated in the middle area, and thus the signal lines in the middle area are prevented from being blew out, which also maintains the functionality of the panel. In brief, better ESD protection capability is provided between the GOA signal lines.

DETAILED DESCRIPTION OF THE EMBODIMENTS

Embodiments of the invention will now be described more fully hereinafter with reference to the accompanying drawings, in which embodiments of the invention are shown.

Figure 1:
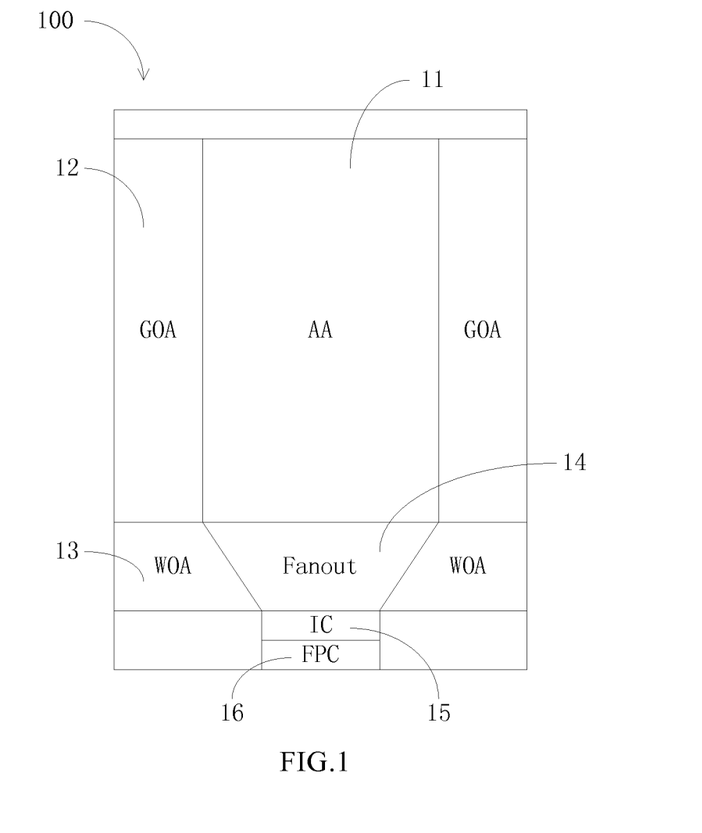
FIG. 1 is a schematic view of the array substrate in accordance with one embodiment.

FIG. 1 is a schematic view of the array substrate in accordance with one embodiment. The array substrate 100 includes an active area (AA) 11, a gate driver on array (GOA) area 12, a wire on array (WOA) area 13, a fan-out area 14, an integrated circuit (IC) area 15, and a flexible printed circuit (FPC) area 16.

The AA area 11 includes at least one pixel electrode and at least one TFT for displaying the pixels.

The GOA area 12 generates gate driving signals of the TFTs within the AA area 11 so as to perform column scanning with respect to the pixel electrodes. In addition, the GOA area 12 is arranged at two lateral sides of the AA area 11 such that the AA area 11 may be driven from two lateral sides.

The WOA area 13 connects the wirings in a rim of the array substrate 100.

The fan-out area 14 configures the wirings of the data lines in the IC area 15 and the AA area 11.

The IC area 15 is configured for IC bonding. That is, the ICs are bonded on the array substrate 100, and the ICs drives the circuits within the array substrate 100 so as to drive the pixel electrodes.

The FPC area 16 is for FPC bonding. The array substrate 100 connects to a main board via FPC so as to constitute the display panel, and thus the display panel may display.

The array substrate 100 of the above six areas adopt GOA technology. Most of the signal lines on the array substrate 100 are in the GOA area 12. Thus, the ESD protection design of the array substrate 100 mainly focuses on the signal lines within the GOA area 12.

Figure 2:
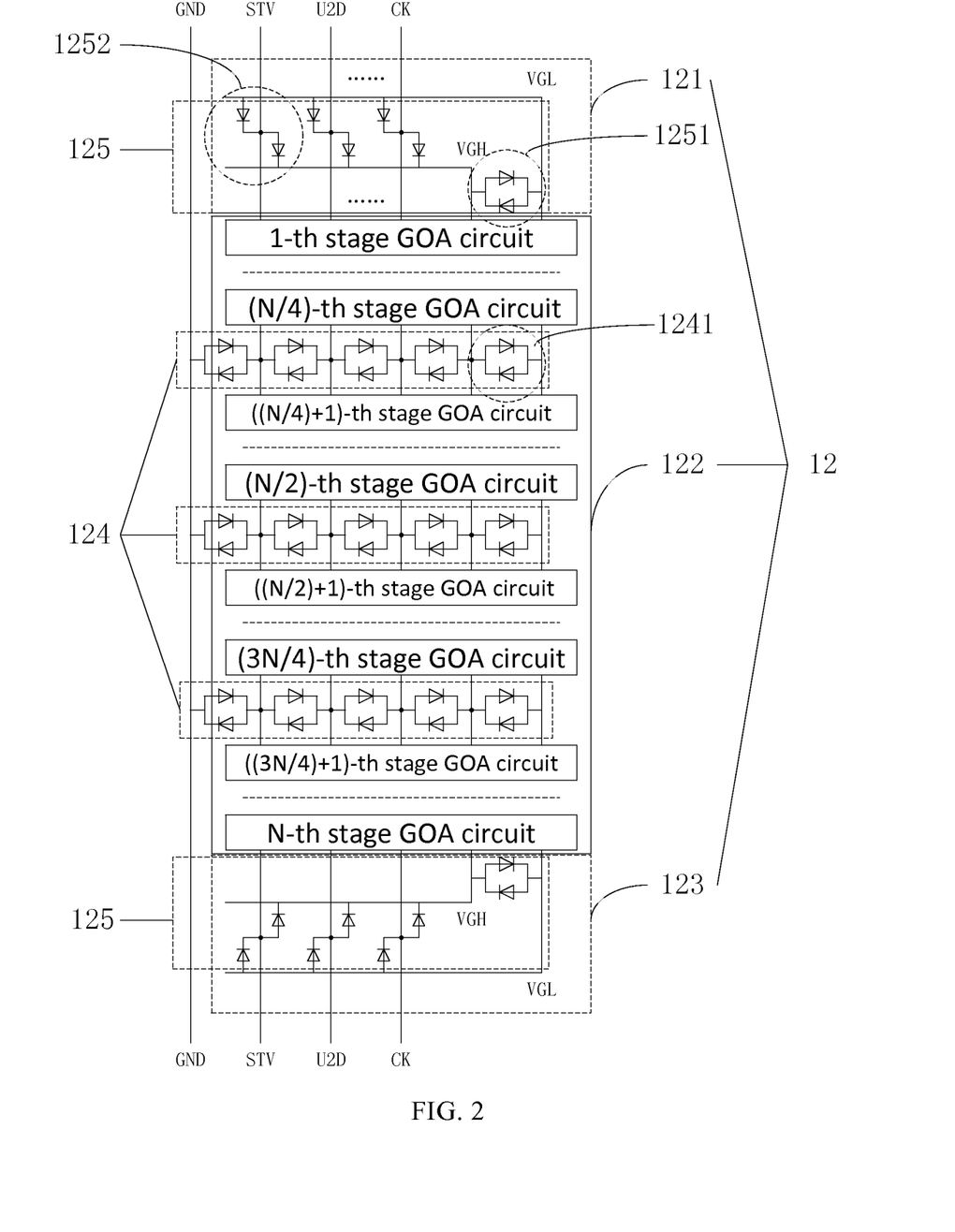
FIG. 2 is a schematic view of the ESD protection of the GOA area on the array substrate of FIG. 1.
Figure 3:
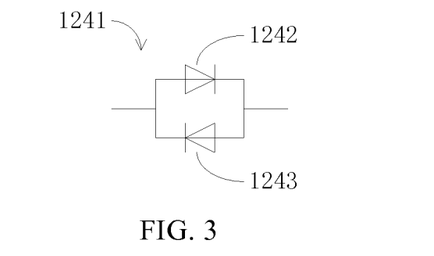
FIG. 3 is a schematic view of the first ESD protection unit of the first ESD protection unit of the GOA area of FIG. 2.
Figure 4:
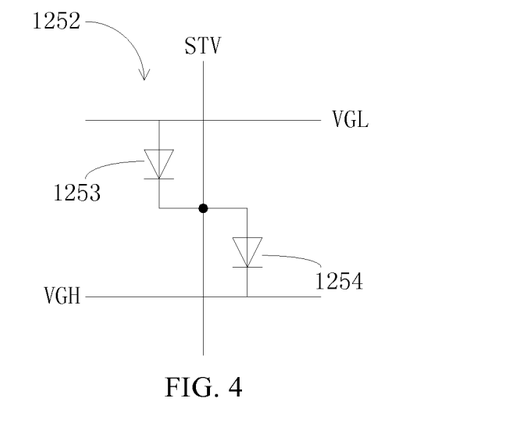
FIG. 4 is a schematic view of the ESD protection unit of the second ESD protection unit of the GOA area of FIG. 2.

FIG. 2 is a schematic view of the ESD protection of the GOA area on the array substrate of FIG. 1. FIG. 3 is a schematic view of the first ESD protection unit of the first ESD protection unit of the GOA area of FIG. 2. FIG. 4 is a schematic view of the ESD protection unit of the second ESD protection unit of the GOA area of FIG. 2. GND wirings are configured at outer sides of the GOA areas 12. The GND wirings surrounds a rim of the array substrate 100 so as to provide ESD protection for the array substrate 100.

With respect to the GOA area 12, a variety of GOA signal lines and N-th stage signal lines and N-th stage GOA circuits. The N-th stage GOA circuits include a variety of GOA signal lines that have been connected in serious. That is, the signals of the GOA circuit pass by the stages one by one. The signals from the GOA circuit of the previous stage are provided to the GOA circuit of the next stage by connecting the GOA signal lines of the GOA circuits of the two stages.

As the column scanning signals of the pixel electrodes are provided by the GOA circuits, generally, the number of the stages of the GOA circuits corresponds to the number of the column pixel electrodes within the AA area 11. With the increasing demand of high resolution of the liquid crystal panel, the number of the pixel electrodes is also increased. Correspondingly, multi-stage GOA circuits are configured on the array substrate 100. In the embodiment, the number of N may be 1920. It can be easily conceived that the value of N may be configured accordingly.

When a larger number of the stages of the GOA circuits are configured on the array substrate 100, a density of the GOA signal lines between the GOA circuits is higher. Thus, it is needed to provide ESD protection for the GOA signal lines on the array substrate 100.

In the embodiment, the GOA signal lines may include STV signal lines, U2D signal lines, CK signal lines, VGH signal lines, and VGL signal lines. The STV signal lines may be initial signal lines of the GOA circuits. The U2D signal lines are for controlling positive scanning of GOA circuits. The CK signal lines may be the clock signal lines for generating and controlling the gate shift signals. The VGH signal lines may be high-voltage-source signal lines. The VGL signal lines may be low-voltage-source signal lines. The VGH signal lines and the VGL signal lines provide the power for the GOA circuits.

In the above disclosure, only several basic GOA signal lines are described. It can be understood that other signal lines, such as D2U signal lines, CK1 signal lines, CK2 signal lines, may be configured in accordance with real scenarios.

In addition, frequencies adopted by each of the GOA signal lines may be different. For instance, the VGH signal lines and the VGL signal lines are configured for provide the power, and thus the frequencies of the two signal lines are higher than that of the other signal lines. Also, the VGH signal lines and the VGL signal lines may be thicker than others.

In the embodiment, the configuration of the signal line wirings may be different. The GOA area 12 is divided into three areas to provide the ESD protection. The three areas includes an upper area 121 arranged above the 1-th stage GOA circuit, a middle area 122 arranged between the 1-th stage GOA circuit and the N-th stage GOA circuit, and a down area 123 below the N-th stage GOA circuit.

Within the middle area 122, the GOA signal lines have not overlapped with each. The GOA signal lines are configured to be parallel to each other. When static electricity has been accumulated to a certain degree, the current generated between the GOA signal lines may be large such that the signal lines may be brew out. Within the upper area 121 and the down area 123, the VGH signal lines and the VGL signal lines are overlapped with each other. With such configuration, large current may be generated at the overlapped locations such that the signal lines may be brew out.

Thus, a first ESD protection circuit 124 may be configured in the middle area 122 for discharging abnormal electrical charges of the GOA signal lines within the middle area 122. In addition, a second ESD protection circuit 125 may be configured respectively in the upper area 121 and in the down area 123 for discharging abnormal electrical charges of the GOA signal lines within the upper area 121 and the down area 123.

The first ESD protection circuit 124 includes a plurality of ESD protection units 1241 between the GOA signal lines and the GND wirings, and a plurality of ESD protection units 1241 between a variety of GOA signal lines.

The ESD protection units 1241 between the GOA signal lines and the GND wirings are configured to be symmetrical in the middle area 122. When N equals to 2n (even number), the ESD protection units 1241 are arranged between the n-th stage GOA circuit and (n+1)-th stage GOA circuit, wherein n results from N/2. Similarly, the ESD protection units 1241 are arranged at an upper side of the n-th GOA circuit and are arranged at a down side of the (n+1)-th stage GOA circuit in a symmetrical way.

When N equals to 2n+1, the ESD protection units 1241 are symmetrically arranged at the upper side and the down side of the (n+1)-th GOA circuit, such as between the n-th stage GOA circuit and the (n+1)-th stage GOA circuit and between the (n+1)-th stage GOA circuit and the (n+2)-th stage GOA circuit.

Similarly, the ESD protection units 1241 are symmetrically arranged between the GOA signal lines within the middle area 122. Within such symmetrical configuration, the fewest number of ESD protection units have to be adopted within the middle area 122 so as to achieve the best ESD protection. In other embodiments, the ESD protection units 1241 may be configured in other ways.

In the embodiment, the GOA signal lines includes STV signal lines, U2D signal lines, CK signal lines, VGH signal lines and VGL signal lines. Thus, the ESD protection units 1241 are provided between the STV signal lines and the U2D signal lines, between the U2D signal lines and the CK signal lines, between the CK signal lines and the VGH signal lines, or between the VGH signal lines and the VGL signal lines.

In the above embodiments, the ESD protection units 1241 are arranged between all of the GOA signal lines so as to discharge the abnormal charges of the GOA signal lines. To save the materials and to simplify the complexity of the ESD protection circuit of the GOA area, the ESD protection units 1241 may be arranged between a portion of the GOA signal lines.

Specifically, the ESD protection units 1241 include a first diode 1242 and a second diode 1243, and the two diodes are of the same type. A positive end of the first diode 1242 electrically connects to a negative end of the second diode 1243. The negative end of the first diode 1242 electrically connects to the positive end of the second diode 1243. Afterward, the ESD protection units 1241 are provided between two GOA signal lines. The static electricity may be discharged from the first diode 1242 or the second diode 1243 to another GOA signal lines regardless the charges are accumulated on which GOA signal line.

As the diode may be turned on under a certain voltage condition, the ESD protection units between the GOA signal lines may not affect the operation signals, which is relatively weak. In addition, the static electricity may only be discharged toward the diodes when the accumulated charges reach a certain degree.

Basing on the above principle, the ESD protection units 1241 operates as a resistor having great resistance. When the charges are discharged, the normal signals may not be affected. In an example, the diode may be replaced by a triode. In the embodiment, the TFT transistor is adopted.

When a N-type TFT is adopted, the drain and the gate are connected, which is substantially the same with the positive end of the diode, and the source is substantially the same with the negative end of the diode. When a P-type TFT is adopted, the source is substantially the same with the positive end of the diode, and the drain and the gate are connected, which is substantially the same with the negative end of the diode.

The second ESD protection circuit 125 includes a first ESD protection unit 1251, which is the same with the ESD protection units 1241 of the first ESD protection circuit 124. The two diodes connected in parallel are configured to discharge the static electricity between the VGH signal lines and the VGL signal lines.

The second ESD protection circuit 125 further includes at least one second ESD protection unit 1252 between the GOA signal lines and the VGH signal lines and between the VGL signal lines. The second ESD protection unit 1252 may also include two diodes of the same type, that is, a third diode 1253 and a fourth diode 1254. Taking the second ESD protection unit 1252 between the STV signal lines, the VGH signal lines, and the VGL signal lines as an example, the positive end of the third diode 1253 connects to the VGL signal line, and the negative end of the third diode 1253 connects to the STV signal line. The positive end of the fourth diode 1254 connects to the STV signal line, and the negative end of the fourth diode 1254 connects to the VGH signal line. The same ESD protection units may be configured between other GOA signal lines and VGH signal lines and between the VGL signal lines, and the diodes may be replaced by the triodes.

In view of the above, the middle area between the 1-th stage GOA circuit and the N-th stage GOA circuit includes a first ESD protection circuit for discharging abnormal charges in the middle area generated by the GOA signal lines. With such configuration, a huge amount of static electricity is prevented from being generated in the middle area, and thus the signal lines in the middle area are prevented from being blew out, which also maintains the functionality of the panel. In addition, the ESD protection units are arranged between the VGH signal lines and VGL signal lines above the 1-th stage GOA circuit and below the N-th stage GOA circuit, which further enhances the ESD protection capability between the VGH signal lines and the VGL signal lines.

Figure 5:
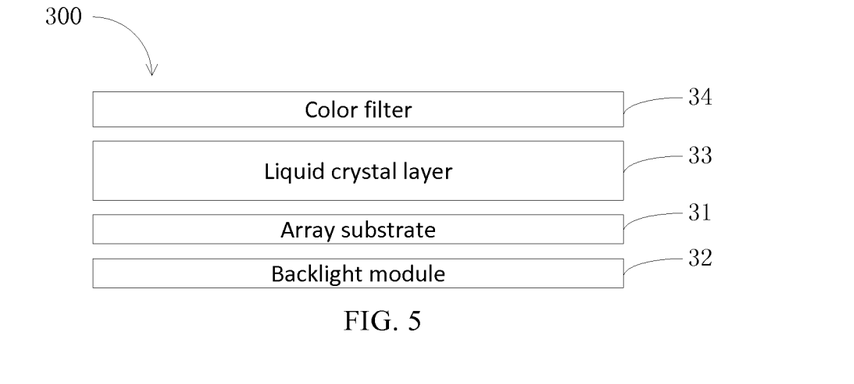
FIG. 5 is a schematic view of the display panel in accordance with one embodiment.

FIG. 5 is a schematic view of the display panel in accordance with one embodiment. The display panel 300 includes an array substrate 31, a backlight module 32, a liquid crystal layer 33, and a color filter 34.

The array substrate 31 includes the GOA area. The middle area between the 1-th stage GOA circuit and the N-th stage GOA circuit includes the first ESD protection circuit for discharging the abnormal electric charges generated by the GOA signal lines within the middle area. The array substrate 31 may be the above array substrate 100.

The backlight module 32 is arranged in the bottom of the display panel 300, and the array substrate 31, the liquid crystal layer 33, the color filter 34 are stacked together in turn.

Figure 6:
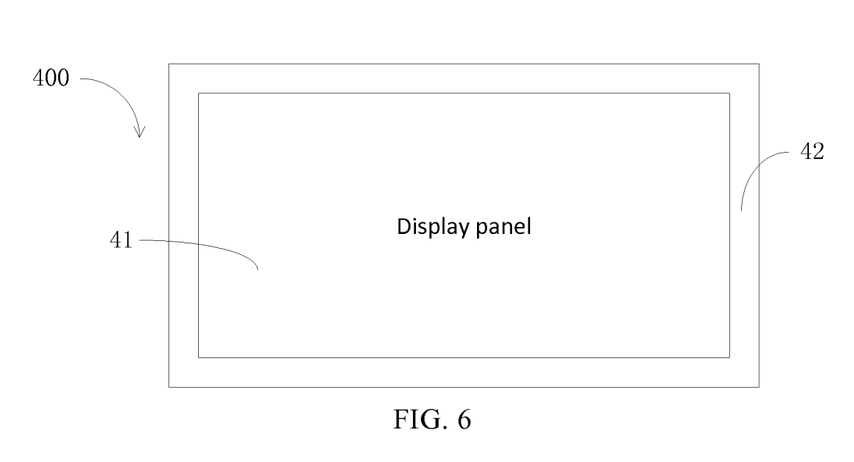
FIG. 6 is a schematic view of the display device in accordance with one embodiment.

FIG. 6 is a schematic view of the display device in accordance with one embodiment. The display device may be cellular phones, tablets, televisions, and computers having LCD or OLED devices. The display device 400 includes a display panel 41 and a frame 42 for supporting and protecting the display panel 41.

The display panel 41 is similar to the display panel 300 in the above disclosure.

In view of the above, the array substrate includes at least one GOA area and GND wirings arranged at outer sides of the GOA area. The GOA area includes a variety of GOA signal lines and N-th stage circuit connected by the GOA signal lines. The middle area between the 1-th stage GOA circuit and the N-th stage GOA circuit includes a first ESD protection circuit for discharging abnormal charges in the middle area generated by the GOA signal lines. With such configuration, a huge amount of static electricity is prevented from being generated in the middle area, and thus the signal lines in the middle area are prevented from being blew out, which also maintains the functionality of the panel. In brief, better ESD protection capability is provided between the GOA signal lines.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An array substrate, comprising:
   GND wirings and GOA areas, the GND wirings being configured at outer sides of the GOA areas, the GOA area comprising a variety of GOA signal lines and N-th stage GOA circuits electrically connected by the GOA signal lines, a first ESD protection circuit being configured in a middle area between a 1-th stage GOA circuit and the N-th stage GOA circuit to discharge abnormal electrical charges of the GOA signal lines within the middle area.

2. The array substrate as claimed in claim 1, wherein the first ESD protection circuit comprises a plurality of ESD protection units between the GOA signal lines and the GND wirings.

3. The array substrate as claimed in claim 2, wherein the ESD protection units between the GOA signal lines and the GND wirings are configured to be symmetrical in the middle area.

4. The array substrate as claimed in claim 1, wherein the first ESD protection circuit comprises a plurality of ESD protection units between the GOA signal lines.

5. The array substrate as claimed in claim 4, wherein the ESD protection units between the GOA signal lines are configured to be symmetrical in the middle area.

6. The array substrate as claimed in claim 4, wherein the GOA signal lines comprises STV signal lines, U2D signal lines, CK signal lines, VGH signal lines, and VGL signal lines, the ESD protection units are provided between the STV signal line and the U2D signal line, between the U2D signal line and the CK signal line, between the CK signal line and the VGH signal line, or between the VGH signal line and the VGL signal line.

7. The array substrate as claimed in claim 1, wherein a second ESD protection circuit is configured respectively in the upper area of the 1-th stage GOA circuit and a down area of the N-th stage GOA circuit, the GOA signal lines comprise VGH signal lines and VGL signal lines; and
   the second ESD protection circuit comprises the ESD protection units arranged between the VGH signal lines and the VGL signal lines in the upper area and arranged between the VGH signal lines and the VGL signal lines.

8. The array substrate as claimed in claim 2, wherein the ESD protection unit comprises a first diode and a second diode connected in parallel, and a positive end of the first diode electrically connects to a negative end of the second diode, and the negative end of the first diode electrically connects to the positive end of the second diode.

9. The array substrate as claimed in claim 4, wherein the ESD protection unit comprises a first diode and a second diode connected in parallel, and a positive end of the first diode electrically connects to a negative end of the second diode, and the negative end of the first diode electrically connects to the positive end of the second diode.

10. The array substrate as claimed in claim 7, wherein the ESD protection unit comprises a first diode and a second diode connected in parallel, and a positive end of the first diode electrically connects to a negative end of the second diode, and the negative end of the first diode electrically connects to the positive end of the second diode.

11. A display panel, comprising:
    an array substrate comprising GND wiring and GOA areas, GND wirings and GOA areas, the GND wirings being configured at outer sides of the GOA areas, the GOA area comprising a variety of GOA signal lines and N-th stage GOA circuits electrically connected by the GOA signal lines, a first ESD protection circuit being configured in a middle area between a 1-th stage GOA circuit and the N-th stage GOA circuit to discharge abnormal electrical charges of the GOA signal lines within the middle area.

12. The display panel as claimed in claim 11, wherein the first ESD protection circuit comprises a plurality of ESD protection units between the GOA signal lines and the GND wirings.

13. The display panel as claimed in claim 12, wherein the ESD protection units between the GOA signal lines and the GND wirings are configured to be symmetrical in the middle area.

14. The display panel as claimed in claim 11, wherein the first ESD protection circuit comprises a plurality of ESD protection units between the GOA signal lines.

15. The display panel as claimed in claim 14, wherein the ESD protection units between the GOA signal lines are configured to be symmetrical in the middle area.

16. The display panel as claimed in claim 11, wherein the GOA signal lines comprises STV signal lines, U2D signal lines, CK signal lines, VGH signal lines, and VGL signal lines, the ESD protection units are provided between the STV signal line and the U2D signal line, between the U2D signal line and the CK signal line, between the CK signal line and the VGH signal line, or between the VGH signal line and the VGL signal line.

17. A display device, comprising:
    a display panel comprising an array substrate, the array substrate comprising GND wiring and GOA areas, GND wirings and GOA areas, the GND wirings being configured at outer sides of the GOA areas, the GOA area comprising a variety of GOA signal lines and N-th stage GOA circuits electrically connected by the GOA signal lines, a first ESD protection circuit being configured in a middle area between a 1-th stage GOA circuit and the N-th stage GOA circuit to discharge abnormal electrical charges of the GOA signal lines within the middle area.

18. The display device as claimed in claim 17, wherein the first ESD protection circuit comprises a plurality of ESD protection units between the GOA signal lines and the GND wirings.

19. The display device as claimed in claim 18, wherein the ESD protection units between the GOA signal lines and the GND wirings are configured to be symmetrical in the middle area.

20. The display device as claimed in claim 17, wherein the first ESD protection circuit comprises a plurality of ESD protection units between the GOA signal lines.

* * * * *